United States Patent [19]

Prabhu et al.

[11] Patent Number: 4,733,018

[45] Date of Patent: Mar. 22, 1988

[54] THICK FILM COPPER CONDUCTOR INKS

[75] Inventors: Ashok N. Prabhu, E. Windsor Township, Mercer County; Kenneth W. Hang, W. Windsor Township, Mercer County; Edward J. Conlon, Princeton Township, Mercer County, all of N.J.

[73] Assignee: RCA Corporation, Princeton, N.J.

[21] Appl. No.: 914,304

[22] Filed: Oct. 2, 1986

[51] Int. Cl.[4] .................. H05K 1/09; C03C 8/04; C03C 8/16; C03C 8/18

[52] U.S. Cl. ................... 174/68.5; 361/305; 361/411; 501/19; 501/20; 106/1.13; 106/1.18; 252/512; 252/521

[58] Field of Search .............. 501/19, 21, 22, 26; 106/1.13, 1.18; 252/512, 521; 361/305, 411; 174/68.5

[56] References Cited

U.S. PATENT DOCUMENTS

| | | | |
|---|---|---|---|
| 3,022,179 | 2/1962 | Morrissey | 106/39 |
| 3,501,322 | 3/1970 | Dumbaugh, Jr. et al. | 106/48 |
| 3,876,407 | 4/1975 | Hirose et al. | 65/30 |
| 4,049,872 | 9/1977 | Hang | 428/427 |
| 4,061,584 | 12/1977 | Girard et al. | 252/63 |
| 4,256,796 | 3/1981 | Hang et al. | 428/210 |
| 4,355,114 | 10/1982 | Hang et al. | 501/5 |
| 4,355,115 | 10/1982 | Hang et al. | 501/21 |
| 4,369,220 | 1/1983 | Prabhu et al. | 428/209 |
| 4,369,254 | 1/1983 | Prabhu et al. | 501/21 |
| 4,376,725 | 3/1983 | Prabhu et al. | 252/512 |
| 4,377,642 | 3/1983 | Prabhu et al. | 501/20 |
| 4,385,127 | 5/1983 | Chyung | 501/5 |
| 4,399,320 | 8/1983 | Prabhu et al. | 174/68.5 |
| 4,400,214 | 8/1983 | Ogawa et al. | 106/1.13 |
| 4,401,709 | 8/1983 | Prabhu et al. | 428/209 |
| 4,415,624 | 11/1983 | Prabhu et al. | 428/209 |
| 4,514,321 | 4/1985 | Siuta | 252/512 |
| 4,521,329 | 6/1985 | Siuta et al. | 252/512 |
| 4,536,535 | 8/1985 | Usala | 524/403 |
| 4,540,604 | 9/1985 | Siuta | 427/96 |
| 4,619,836 | 10/1986 | Prabhu et al. | 427/41 |
| 4,623,482 | 11/1986 | Kuo et al. | 252/512 |

FOREIGN PATENT DOCUMENTS

| | | |
|---|---|---|
| 0084936 | 8/1983 | European Pat. Off. |
| 174544 | 10/1984 | Japan. |

OTHER PUBLICATIONS

Harper, C. A., *Handbook of Thick Film Hybrid Microelectronics*, McGraw-Hill, Inc., 1974, pp. 4–26 and 4–27.

*Primary Examiner*—Mark L. Bell
*Assistant Examiner*—A. Knab
*Attorney, Agent, or Firm*—James Magee, Jr.; James C. Davis, Jr.

[57] ABSTRACT

Improved copper conductor inks useful in fabricating multilevel circuits are provided. The inks comprise copper powder, a novel zinc-aluminum-lead-borosilicate glass frit, bismuth oxide and a suitable organic vehicle. The inks are advantageous in that the films formed therefrom are oxidation resistant and have a reduced tendency for flux components to leach into adjacent dielectric films.

6 Claims, No Drawings

THICK FILM COPPER CONDUCTOR INKS

This invention relates to thick film copper conductor inks and their use in fabricating multilayer electrical circuit structures.

BACKGROUND OF THE INVENTION

The use of specialized ink formulations to form thick films having various functions on suitable substrates in the construction of multilayer integrated circuits is known in the art. Such technology is of increasing interest in the production of very dense multilayer circuit patterns on various substrates for a wide variety of applications in the electronics industry.

Thick film multilayer structures based on copper conductors typically are comprised of at least two patterned layers of copper conductor separated by a dielectric layer. The patterned conductor layers are connected by copper deposited in vias in the dielectric layer. Such structures are formed by multiple deposition and firing of layers of copper and dielectric inks.

Such multilayer circuit structures utilizing copper as the conductor metal have a number of problems. The most common is failure caused by the development of electrical shorts due to interactions between materials of the copper conductor ink and those of the dielectric layer which take place during the multiple firings necessary to fabricate a multilayer integrated circuit. The responsible materials present in conventional copper conductor inks include copper oxide which forms upon exposure of the ink to air or an oxidizing atmosphere and flux materials such as lead oxide and bismuth oxide. These materials will penetrate a porous dielectric material, particularly if it contains large modifier ions such as lead, barium and bismuth. The penetration of such materials is enhanced by the fact that the multiple firing steps are conventionally carried out at temperatures well above the temperature at which copper oxide forms an eutectic mixture with lead or bismuth oxides.

A second problem common to both dielectric and copper conductor inks is the entrapment of gaseous materials formed during repeated firings as a result of the incomplete removal of the carbonaceous residue of the organic vehicle present in conventional ink formulations. The escaping gaseous materials can cause blistering of the thick films formed from the inks during subsequent firings and is also responsible for the porosity of dielectric films.

An approach to reducing the incidence of electrical shorts from these problems is to formulate dielectric inks which form thick films having reduced porosity. A second approach is to treat functional inks, e.g. dielectric and copper conductor inks, with an oxidizing or reducing plasma prior to firing as disclosed by Prabhu et al. in U.S. Pat. No. 4,619,836, filed Oct. 28, 1986, the disclosure of which is incorporated herein by reference. The plasma treatment removes the carbonaceous residue of the organic vehicle present in conventional ink formulations.

A third possibility is the formulation of improved copper conductor inks. Such improved inks are provided in accordance with this invention.

SUMMARY OF THE INVENTION

Improved copper conductor inks contain a novel zinc-aluminum-lead-borosilicate glass frit. The subject inks are resistant to oxidation, thereby minimizing the formation of copper oxide which can penetrate into adjacent dielectric materials. The subject inks are utilized in the fabrication of multilayer integrated circuit structures.

DETAILED DESCRIPTION OF THE INVENTION

The copper conductor inks of this invention are comprised of copper powder, a zinc-aluminum-lead-borosilicate glass frit, bismuth oxide and a suitable organic vehicle.

The copper powder utilized in the subject conductive inks is pure copper having a particle size of from about 1 to 5 micrometers. The copper comprises from about 65 to 85, preferably from about 75 to 80, percent by weight of the subject ink compositions.

The novel glass frit of the inks of this invention is a zinc-aluminum-lead-borosilicate glass consisting of, on a weight basis:

(a) from about 52 to 53, preferably about 52.5, percent of zinc oxide;

(b) from about 25 to 26, preferably about 25.4, percent of boron trioxide;

(c) from about 6 to 8, preferably about 7.3, percent of silicon dioxide;

(d) from about 7 to 12, preferably about 9.7, percent of lead oxide;

(e) from about 2 to 5, preferably 3.7, percent of aluminum oxide;

(f) from 0 to about 2, preferably about 1.1, percent of antimony trioxide; and (g) from 0 to about 1, preferably about 0.3, percent of cerium oxide. The glass frits are conventionally prepared by comminuting the various oxides, thoroughly mixing them in the appropriate proportion and melting the mixed oxides, e.g. in air at 1450°-1600° C. The glass frit comprises from about 5 to 15, preferably from about 6 to 9, percent by weight of the subject inks.

The subject inks contain from about 1 to 4, preferably from about 2 to 3, percent by weight of bismuth oxide as an adjunct to the adherence of the copper conductors formed from the subject inks. It is preferred in accordance with this invention to incorporate not more than about four percent by weight of bismuth oxide in the subject inks, thereby minimizing adverse effects resulting from the penetration thereof into dielectric materials.

The organic vehicles are solutions of resin binders such as, for example, cellulose derivatives, particularly ethyl cellulose, synthetic resins such as polyacrylates, polymethacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2,4-trimethyl-1,3-pentanediol monoisobutyrate available from Texas Eastman Company under the trademark Texanol and the like. The vehicles suitably contain from about 5 to about 25 percent by weight of the resin binder.

The above resin binders may be utilized individually or in any combination of two or more. A suitable viscosity modifier can be added to the resin material if desired. Such a modifier can be, for example, a castor oil derivative available from N.L. Industries under the trademark Thixatrol.

The vehicle of the subject inks may also contain up to about 25 percent, preferably from about 10 to about 20, percent by weight, based on the vehicle, of a suitable wetting agent of the type conventionally used in copper conductor inks to aid in coating the particles of copper powder with the organic vehicle. As is the case with all components of the organic vehicle, the wetting agent must fire cleanly in nitrogen, i.e., without leaving a carbonaceous residue. A preferred wetting agent is a dispersion of a complex multifunctional, aliphatic hydrocarbon in an aliphatic hydrocarbon oil available under the trademark Hypothiolate 100 from Central Compounding Company, Chicago, Ill. The vehicles also suitably contain from about 0.5 to about 10, preferably from about 1 to about 3, percent by weight of a suitable surfactant such as oleylamine, available as Armeen O, or a high molecular weight N-alkyl-1,3-diaminopropane dioleate, available as Duomeen TDO, both from AKZO Chemie America. The organic vehicle comprises from about 5 to about 25, preferably from about 12 to about 16, percent by weight, of the subject inks. Regardless of the vehicle utilized, it is important that the homogeneity of the ink be maximized. Therefore, mixing is suitably carried out in a conventional apparatus which mixes in combination with subjecting the dispersion to high shearing action.

The improved copper conductor inks of this invention are applied to the substrate structures by conventional means, e.g. screen printing, brushing, spraying and the like, with screen printing being preferred. The coating of ink is dried in air at 100°-125° C. for about 15 minutes. The resulting film is then fired in nitrogen at from about 800° to 950° C. for from 4 to 10 minutes to form a copper conductor layer comprising from about 70 to about 94 percent by weight of copper powder, from about 5 to about 18 percent by weight of the glass frit and from about 1 to about 4 percent by weight of bismuth oxide. Copper conductor layers formed from the inks of this invention are advantageous in that they demonstrate good conductivity, solder leach resistance and resistance to oxidation.

The subject inks are advantageous in being particularly suitable for forming the initial patterned copper layers and succeeding intermediate copper layers in a multilayer circuit, which layers are each covered with dielectric material. The coefficient of expansion of copper layers formed from the inks of this invention is compatible with that of conventional circuit board materials, e.g. alumina.

A significant advantage of the subject inks is that, after firing, the surface of the layers formed from the subject inks is predominately glass. Therefore, the layers are resistant to oxidation during processing. As a result, a layer of dielectric material overlying copper layers formed from the subject inks may be treated with an oxygen plasma to remove carbonaceous residues as described in the aforementioned Prabhu et al. U.S. Pat. No. 4,619,836 without oxidizing the copper to an appreciable degree. This is advantageous in that the plasma treatment may be beneficial to removing carbonaceous residues from the dielectric layers.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A copper conductor ink was prepared by mixing 77 parts of copper powder having an average particle size of 3 micrometers, 2 parts of bismuth oxide powder and 6 parts of a glass frit. The glass frit was comprised of 52.5 percent of zinc oxide, 25.4 percent of boron trioxide, 7.3 percent of silicon dioxide, 9.7 percent of lead oxide, 3.7 percent of aluminum oxide, 1.1 percent of antimony trioxide and 0.3 percent of cerium oxide. The solid ingredients were mixed with 15 parts of an organic vehicle consisting of a 6 percent solution of ethyl cellulose in Texanol, additionally containing the wetting agents Hypothiolate 100 and Armeen O in concentrations of 17 percent and 3 percent, respectively, based on the vehicle. The ink was initially hand-mixed and then mixed on a three-roll mill to obtain a paste suitable for screen printing. Additional solvent was added as necessary to assure proper rheology.

The ink was printed onto a conventional alumina board to form a series of isolated parallel lines 375 micrometers wide separated by spaces of equal width. The copper ink was dried in air at 125° for 15 minutes and fired in nitrogen at 900° for 10 minutes. The substrates were entirely coated with an improved dielectric ink as disclosed in Hang et al. copending U.S. patent application Ser. No. 914,314 entitled "DIELECTRIC INKS FOR MULTILAYER COPPER CIRCUITS", filed Oct. 2, 1986 and incorporated herein by reference. The dielectric ink was prepared in the general manner described above and consisted of 76.9 parts of a glass frit and 23.1 parts of an organic vehicle which was a 20 percent solution of poly(isobutylmethacrylate) in Texanol, also containing one percent of Duomeen TDO, based on the vehicle. The glass frit comprised 26.54 percent of magnesium oxide, 17.67 percent of barium oxide, 11.63 percent of aluminum oxide, 14.37 percent of boron trioxide, 25.04 percent of silicon dioxide, 0.77 percent of phosphorous pentoxide and 3.98 percent of zirconium silicate. the dielectric ink was dried in air at 125° for 15 minutes. The substrates were placed in a conventional apparatus and subjected to an oxygen plasma for 120 minutes after which they were fired in nitrogen at 900° for 10 minutes. Microscopic examination showed little evidence that flux components of the copper conductor had penetrated the dielectric material. There was no evidence of blistering of the dielectric layer.

In contrast, a similar structure prepared using a commercial copper conductor ink including the plasma treatment showed considerable discoloration of the copper and substantial penetration of the components of the copper ink into the dielectric. The discoloration of the copper is the result of damage to the surface thereof which was comparatively free of glass.

EXAMPLE 2

The copper conductor ink of Example 1 was printed onto a conventional alumina board to form a series of isolated parallel lines 375 micrometers wide separated by spaces of equal width. The copper ink was dried in air at 125° for 15 minutes and fired in nitrogen at 900° for 10 minutes.

The dielectric ink of Example 1 was printed, dried, plasma treated and fired thereover. Openings or vias were left in the dielectric layer overlying a portion of the copper conductor.

A copper via-fill ink was prepared as follows: a devitrifying glass frit consisting of: 21.8 percent of zinc oxide, 16.5 percent of magnesium oxide; 7.8 percent of barium oxide; 39.2 percent of silicon dioxide; 10.7 percent of aluminum oxide; 1.0 percent of phosphorous pentoxide; and 3.0 percent of zirconium silicate and a vitreous glass frit consisting of: 51.59 percent of barium oxide, 12.58 percent of calcium oxide; 15.62 percent of boron trioxide and 20.21 percent of silicon dioxide were separately prepared and reduced to a particle size of about three micrometers. Solid ingredients consisting of 65 percent of copper powder having an average particle size of three micrometers, 14 percent of devitrifying glass frit and 4 percent of the vitreous glass frit were throughly mixed by hand.

The solid ingredients were mixed with 17 parts of an organic vehicle consisting of a 20 percent solution of poly(isobutylmethacrylate) in Texanol additionally containing, as wetting agents, 17 percent of Hypothiolate 100 and 3 percent of Armeen O. The ink was initially hand-mixed and then mixed on a three-roll mill to obtain a paste suitable for screen printing. Additional solvent was added as necessary to assure proper rheology. The via-fill ink is described in copending U.S. patent application Ser. No. 914,296 of Prabhu et al. entitled "THICK-FILM COPPER VIA-FILL INKS", filed Oct. 2, 1986.

The via-fill ink was printed into the spaces in the dielectric ink, dried in air at 125° for 15 minutes and fired in nitrogen at 900° for 10 minutes. The thickness of the dielectric/copper via-fill was 15 micrometers. The dielectric/copper via-fill depositions were repeated three times to form a final thickness of 45 micrometers. A layer of the copper conductor ink of Example 1 was deposited and fired over the structure so that a portion was in contact with the copper via-fill. This procedure was repeated three times to obtain a multilayer copper-based device having four buried copper layers. In total, 25 firings were required to complete the multilayer circuit.

The structure was biased through electrical contacts made to the copper layers. No evidence of shorting or loss of contact was observed in any of the copper layers.

We claim:

1. A copper conductor ink comprising, on a weight basis:
   (a) from about 65 to about 85 percent of copper powder;
   (b) from about 5 to about 15 percent of a glass frit comprising, on a weight basis:
      from about 52 to 53 percent of zinc oxide;
      from about 25 to 26 percent of boron trioxide;
      from about 6 to 8 percent of silicon dioxide;
      from about 7 to 12 percent of lead oxide;
      from about 2 to 5 percent of aluminum oxide;
      from 0 to about 2 percent of antimony trioxide; and
      from 0 to about 1 percent of cerium oxide;
   (c) from about 1 to about 4 percent of bismuth oxide; and
   (d) from about 5 to about 25 percent of a suitable organic vehicle.

2. A copper ink in accordance with claim 1, wherein the ink comprises, on a weight basis: from about 75 to about 80 percent of copper powder; from about 6 to about 9 percent of the glass frit; from about 2 to about 3 percent of bismuth oxide; and from about 12 to about 16 percent of the organic vehicle.

3. A copper ink in accordance with claim 1, wherein said glass frit comprises, on a weight basis; about 52.5 percent of zinc oxide; about 25.4 percent of boron trioxide; about 7.3 percent of silicon dioxide; about 9.7 percent of lead oxide, about 3.7 percent of aluminum oxide; about 1.1 percent of antimony trioxide and about 0.3 percent of cerium oxide.

4. In a multilayer, copper-based, integrated circuit structure comprising a suitable substrate having thereon at least two patterned layers of a copper conductor, said layers being separated by a dielectric layer having vias therein, said vias being filled with copper to contact said conductor layers, the improvement wherein said copper conductor layers comprise, on a weight basis:
   (a) from about 70 to about 94 percent of copper powder;
   (b) from about 5 to about 18 percent of a glass frit comprising, on a weight basis:
      from about 52 to 53 percent of zinc oxide;
      from about 25 to 26 percent of boron trioxide;
      from about 6 to 8 percent of silicon dioxide;
      from about 7 to 12 percent of lead oxide;
      from about 2 to 5 percent of aluminum oxide;
      from 0 to about 2 percent of antimony trioxide; and
      from 0 to about 1 percent of cerium oxide; and
   (c) from about 1 to about 4 percent of bismuth oxide.

5. A circuit structure in accordance with claim 4, wherein said substrate is an alumina substrate.

6. A circuit structure in accordance with claim 4, wherein said glass frit comprises, on a weight basis: about 52.5 percent of zinc oxide; about 25.4 percent of boron trioxide; about 7.3 percent of silicon dioxide; about 9.7 percent of lead oxide, about 3.7 percent of aluminum oxide; about 1.1 percent of antimony trioxide and about 0.3 percent of cerium oxide.

* * * * *